(12) United States Patent
Chen

(10) Patent No.: US 10,991,702 B2
(45) Date of Patent: Apr. 27, 2021

(54) SEMICONDUCTOR DEVICE AND METHOD OF PREPARING THE SAME

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/413,261

(22) Filed: May 15, 2019

(65) Prior Publication Data
US 2020/0365598 A1 Nov. 19, 2020

(51) Int. Cl.
| | | |
|---|---|---|
| *H01L 27/108* | (2006.01) | |
| *H01L 21/762* | (2006.01) | |
| *H01L 21/265* | (2006.01) | |
| *H01L 21/308* | (2006.01) | |
| *H01L 29/40* | (2006.01) | |
| *H01L 21/311* | (2006.01) | |
| *H01L 21/8234* | (2006.01) | |

(52) U.S. Cl.
CPC .. *H01L 27/10894* (2013.01); *H01L 21/26513* (2013.01); *H01L 21/308* (2013.01); *H01L 21/31144* (2013.01); *H01L 21/76224* (2013.01); *H01L 21/823437* (2013.01); *H01L 27/10897* (2013.01); *H01L 29/401* (2013.01)

(58) Field of Classification Search
CPC ..... H01L 21/76224–76237; H01L 21/823481; H01L 21/823878; H01L 29/41725; H01L 29/41758; H01L 29/41766; H01L 29/41775; H01L 29/41783; H01L 29/4236
See application file for complete search history.

(56) References Cited

U.S. PATENT DOCUMENTS

| | | | |
|---|---|---|---|
| 2008/0173939 A1* | 7/2008 | Shim | H01L 29/66636 257/330 |
| 2012/0211831 A1* | 8/2012 | Hsieh | H01L 29/1095 257/334 |

(Continued)

FOREIGN PATENT DOCUMENTS

TW 201715702 A 5/2017

OTHER PUBLICATIONS

Office Action dated Dec. 27, 2019 related to Taiwanese Application No. 108127020.

*Primary Examiner* — Scott B Geyer
(74) *Attorney, Agent, or Firm* — Muncy, Geissler, Olds & Lowe, P.C.

(57) ABSTRACT

The present disclosure provide a semiconductor device and a method for preparing the semiconductor device. The semiconductor device includes a substrate having a memory cell region and a peripheral region, wherein the memory cell region has at least one first shallow trench isolation and the peripheral region has at least one second shallow trench isolation; a plurality of gates in the first shallow trench isolation; a first semiconductor layer in the peripheral region; a first insulating layer covering the substrate in the memory cell region; a crystalline overlayer in the memory cell region and a doped portion of the substrate below the crystalline overlayer; and a second semiconductor layer on a portion of the first insulating layer, wherein a top surface of the first semiconductor layer and a top surface of the second semiconductor layer are coplanar.

5 Claims, 17 Drawing Sheets

(56) References Cited

U.S. PATENT DOCUMENTS

| | | | |
|---|---|---|---|
| 2013/0320436 A1* | 12/2013 | Kim | H01L 21/76232 257/330 |
| 2014/0117459 A1* | 5/2014 | Kim | H01L 29/401 257/401 |
| 2015/0137225 A1* | 5/2015 | Lui | H01L 27/088 257/331 |
| 2015/0371991 A1 | 12/2015 | Nobuto | |
| 2016/0163858 A1* | 6/2016 | Kim | H01L 27/228 257/331 |
| 2016/0197070 A1* | 7/2016 | Zundel | H01L 21/02 257/334 |
| 2018/0277546 A1* | 9/2018 | Wang | H01L 27/10805 |
| 2019/0019805 A1 | 1/2019 | Feng et al. | |
| 2019/0043866 A1 | 2/2019 | Li et al. | |
| 2019/0206870 A1* | 7/2019 | Gao | H01L 29/267 |
| 2019/0393229 A1* | 12/2019 | Wu | H01L 21/76229 |

\* cited by examiner

SEMICONDUCTOR DEVICE AND METHOD OF PREPARING THE SAME

TECHNICAL FIELD

The present disclosure relates to a semiconductor device and method of preparing the same, and more particularly, to a semiconductor device formed by a method involving planarization processes and corresponding methods.

DISCUSSION OF THE BACKGROUND

In semiconductor fabrication, it is common to use planarization processes to obtain a semiconductor structure. Among a variety of approaches developed in the semiconductor industry, chemical mechanical polishing (hereinafter abbreviated as CMP) process is a common technique widely used to remove excess deposited materials and to provide a planar surface for subsequent levels or processes. In general, the CMP process is performed to planarize layer(s) deposited on a patterned layer or a structure. With the increasing demand for miniaturization, planarization has become a critical process in the fabrication of semiconductors.

During the planarization processes, recesses can be formed on the substrate in order to introduce dopants for leak prevention. However, as the semiconductor structure is scaled down to meet the demand for miniaturization, short channel effects, such as drain-induced barrier lowering, velocity saturation, and hot carrier degradation, may occur.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device comprises a substrate having a memory cell region and a peripheral region, wherein the memory cell region has at least one first shallow trench isolation and the peripheral region has at least one second shallow trench isolation; a plurality of gates disposed in the first shallow trench isolation; a first semiconductor layer disposed in the peripheral region; a first insulating layer covering the substrate in the memory cell region; a crystalline overlayer disposed in the memory cell region and a doped portion of the substrate disposed below the crystalline overlayer, wherein the crystalline overlayer has a conductivity lower than that of the doped portions of the substrate; and a second semiconductor layer disposed on a portion of the first insulating layer, wherein a top surface of the first semiconductor layer and a top surface of the second semiconductor layer are coplanar.

In some embodiments, the first shallow trench isolation has a depth less than a depth of the second shallow trench isolation.

In some embodiments, the first shallow trench isolation has a depth the same as a depth of the second shallow trench isolation.

In some embodiments, the crystalline overlayer has a saddle shape.

In some embodiments, the crystalline overlayer has an excess portion protruding from the substrate.

Another aspect of the present disclosure provides a method of preparing a semiconductor device. The method comprises steps of providing a substrate; forming a plurality of first shallow trench isolations in the substrate; defining a memory cell region and a peripheral region on the substrate, wherein each of the memory cell region and the peripheral region has at least one shallow trench isolation; forming a plurality of gates in the substrate and in the shallow trench isolations; forming a first semiconductor layer in the peripheral region, and covering the first semiconductor layer and the substrate with a first insulating layer; forming a plurality of recesses in the memory cell region, wherein portions of the substrate are exposed at bottoms of the recesses; epitaxially growing a crystalline overlayer on the exposed portions of the substrate; forming a second semiconductor layer, a second insulating layer and a third insulating layer, wherein the first semiconductor layer and the first insulating layer on the substrate are covered by the third insulating layer; removing a portion of the third insulating layer by performing a planarization process to expose the second insulating layer such that a top surface of the third insulating layer and a top surface of the second insulating layer are coplanar; and performing an etch-back process to remove the third insulating layer, the second insulating layer, a portion of the second semiconductor layer and a portion of the first insulating layer such that a top surface of the first semiconductor layer and a top surface of the second semiconductor layer are coplanar.

In some embodiments, the method further includes a step of forming a sacrificial layer on the substrate and forming a patterned hard mask on the sacrificial layer after the forming of the first semiconductor and the first insulating layer.

In some embodiments, the sacrificial layer is an organic dielectric layer.

In some embodiments, the method further includes a step of forming a plurality of openings in the sacrificial layer such that a portion of the first insulating layer is exposed at bottoms of the plurality of openings.

In some embodiments, the method further includes a step of removing the portion of the first insulating layer exposed at the bottoms of the plurality of openings and removing the portion of the substrate below the removed portions of the first insulating layer so as to form the plurality of recesses in the memory cell region.

In some embodiments, the method further includes a step of implanting dopants into the portions of the substrate exposed at the bottoms of the recesses so as to form doped portions of the substrate.

In some embodiments, the crystalline overlayer has a conductivity lower than that of the doped portions of the substrate.

In some embodiments, the crystalline overlayer is selectively grown through the plurality of openings to form a saddle shape having an excess portion protruding from the substrate.

In some embodiments, the method further includes a step of removing the sacrificial layer and the patterned hard mask.

In some embodiments, the second semiconductor layer contacts the portions of the substrate exposed at the bottoms of the recesses.

In some embodiments, the first semiconductor layer and the second semiconductor layer comprise the same material.

Another aspect of the present disclosure provides a method of preparing a semiconductor device. The method includes steps of providing a substrate; forming a plurality of shallow trench isolations in the substrate; defining a memory cell region and a peripheral region on the substrate, wherein each of the memory cell region and the peripheral region has at least one shallow trench isolation; forming a plurality of gates in the substrate and in the shallow trench isolations; forming a first semiconductor layer in the peripheral region and covering the first semiconductor layer and the substrate with a first insulating layer; forming a plurality of recesses in the memory cell region, wherein portions of the substrate are exposed at bottoms of the recesses; introducing dopants into the exposed portions of the substrate to obtain doped portions of the substrate; forming a crystalline overlayer on the doped portions of the substrate, wherein the crystalline overlayer has a conductivity less than that of the doped portions of the substrate; forming a second semiconductor layer, a second insulating layer and a third insulating layer, wherein the first semiconductor layer and the first insulating layer on the substrate are covered by the third insulating layer; removing a portion of the third insulating layer by performing a planarization process to expose the second insulating layer such that a top surface of the third insulating layer and a top surface of the second insulating layer are coplanar; and performing an etch-back process to remove the third insulating layer, the second insulating layer, a portion of the second semiconductor layer and a portion of the first insulating layer such that a top surface of the first semiconductor layer and a top surface of the second semiconductor layer are coplanar.

In some embodiments, the crystalline overlayer is formed by an epitaxial growth process.

In some embodiments, the crystalline overlayer is formed as a saddle shape having an excess portion protruding from the substrate.

In some embodiments, the shallow trench isolations formed in the memory cell region have a depth less than a depth of the shallow trench isolations formed in the peripheral region.

With the above-mentioned method for preparing the semiconductor device, a crystalline overlayer is epitaxially grown on the channel; thus, short channel effect can be effectively reduced and the performance of the semiconductor device can be improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
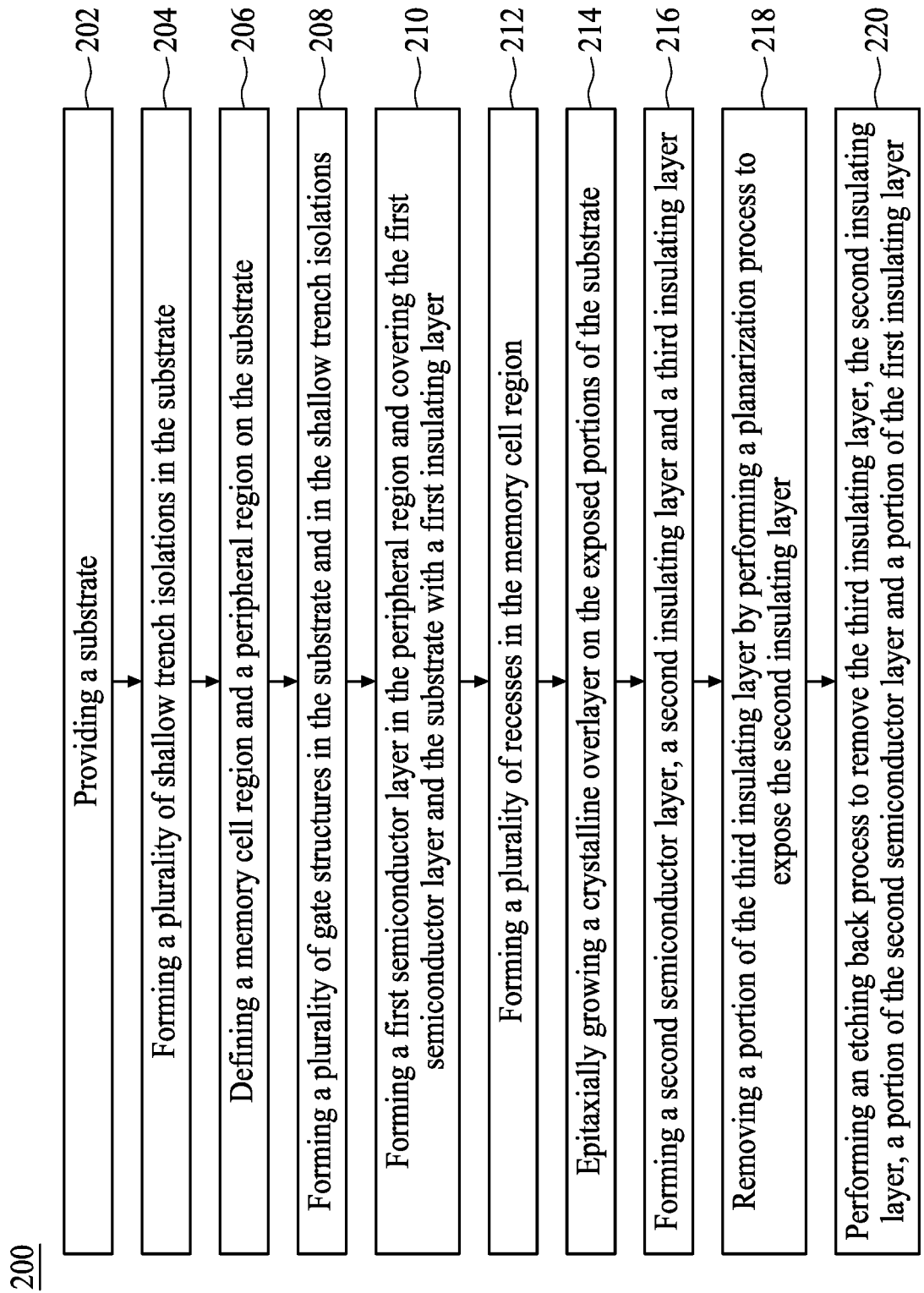
FIG. 1 is a flow diagram illustrating a method for preparing a semiconductor device in accordance to a first embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural finals as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 200 for preparing a semiconductor device in accordance to a first embodiment of the present disclosure. As shown in FIG. 1, the present disclosure provides the method 200 for preparing a semiconductor device with the following steps. In step 202, a substrate is provided. In step 204, a plurality of shallow trench isolations are formed in the substrate. In step 206, a memory cell region and a peripheral region are defined on the substrate. In step 208, a plurality of gates are formed in the substrate and in the shallow trench isolations. In step 210, a first semiconductor layer is formed in the peripheral region and the first semiconductor layer and the substrate are covered with a first insulating layer. In step 212, a plurality of recesses are formed in the memory cell region. In step 214, a crystalline overlayer is epitaxially grown on the exposed portions of the substrate. In step 216, a second semiconductor layer, a second insulating layer and a third insulating layer are formed. In some embodiments, the first semiconductor layer and the first insulating layer on the substrate are covered by the third insulating layer. In step 218, a portion of the third insulating layer is removed by performing a planarization process to expose the second insulating layer such that a top surface of the third insulating layer and a top surface of the second insulating layer are coplanar. In step 220, an etch-back process is performed to remove the third insulating layer, the second insulating layer, a portion of the second semiconductor layer and a portion of the first insulating layer such that a top surface of the first semiconductor layer and a top surface of the second semiconductor layer are coplanar.

Figure 2:
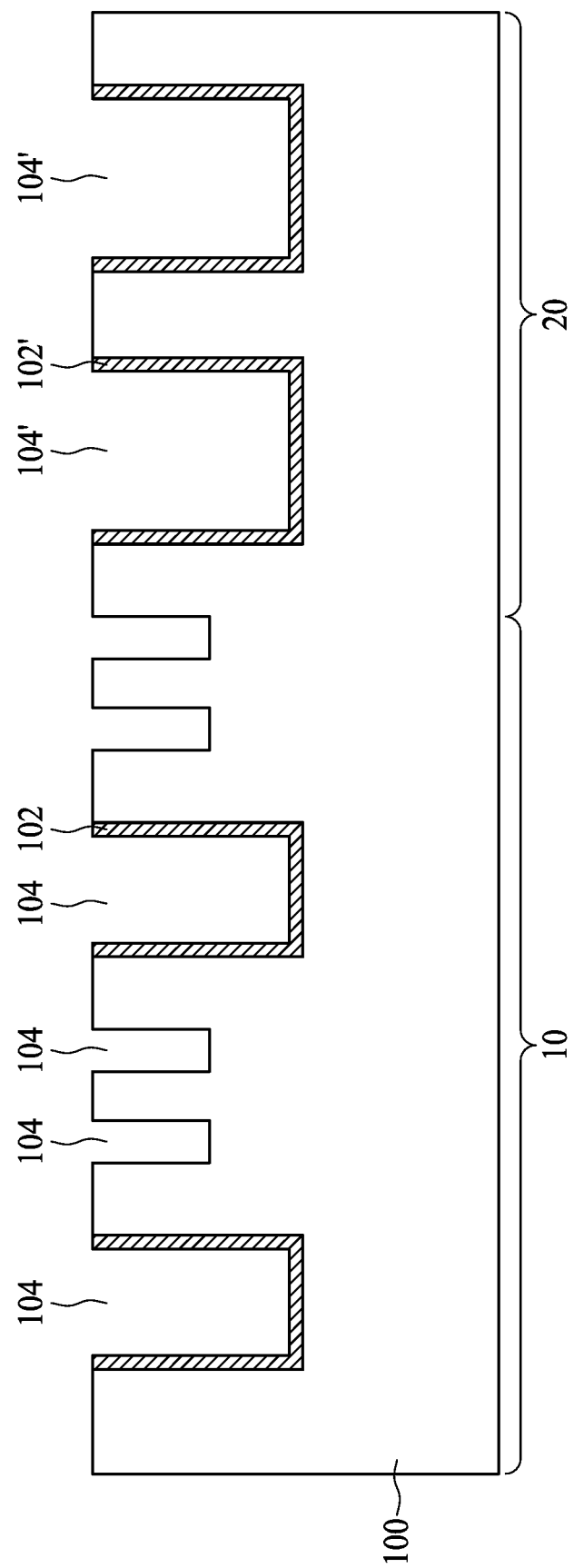
FIGS. 2 to 13 are schematic views illustrating stages of preparing a semiconductor device by the method of FIG. 1 in accordance with some embodiments of the present disclosure.

FIGS. 2 to 13 are schematic views illustrating stages of preparing a semiconductor device 1 by the method 200 of FIG. 1 in accordance with some embodiments of the present disclosure. As shown in FIG. 2, a substrate 100 is provided, and a plurality of shallow trench isolations (hereinafter abbreviated as STI) 102 and 102' are subsequently formed in the substrate 100. As can be seen in FIG. 2, the substrate 100 can be defined as a combination of a memory cell region 10 and a peripheral region 20. In some embodiments of the present disclosure, a depth of the STI 102 in the memory cell region 10 can be less than a depth of the STI 102' in the peripheral region 20. Alternatively, in other embodiments of the present disclosure, the depths of the STIs 102 and 102' in the memory cell region 10 and the peripheral region 20 can be the same. The STIs 102 and 102' in the memory cell region 10 and the peripheral region 20 are used to define a plurality of active regions for accommodating p-typed transistor device(s) and/or n-typed transistor device(s), and to provide electrical isolation.

Subsequently, a plurality of recesses 104 are formed in the substrate 100 and the STI 102 in the memory cell region 10. As illustrated, in some embodiments of the present disclosure, a depth of the recesses 104 in the STI 102 can be greater than a depth of the recesses 104 in the substrate 100. In addition, a plurality of recesses 104' are also formed in the STI 102' in the peripheral region 20.

Figure 3:
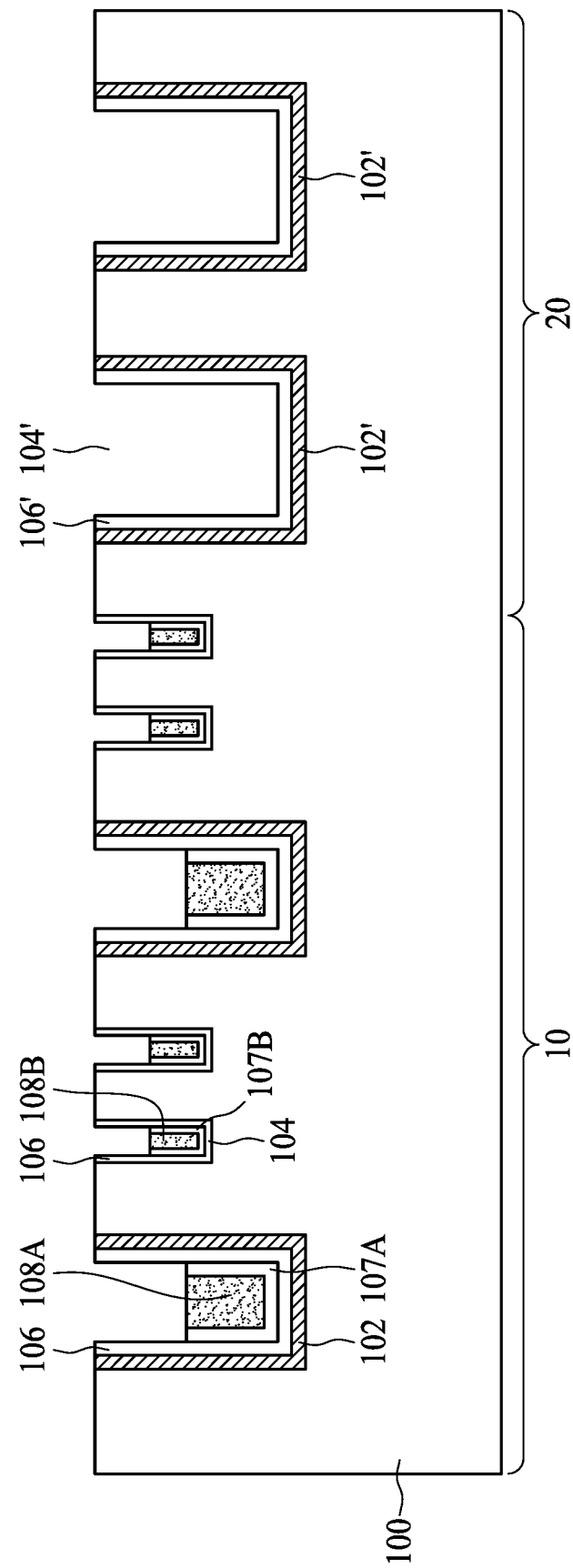

Referring to FIG. 3, which is a schematic drawing illustrating a step subsequent to the step shown in FIG. 2, after the recesses 104 and 104' are formed, sidewalls and bottoms of each of the recesses 104 and 104' are next lined with a dielectric layer 106 or 106'. Subsequently, a buried gate 108A with a gate dielectric 107A and a buried gate 108B with a gate dielectric 107B are respectively formed in the recesses 104 and 102. As illustrated, in some embodiments of the present disclosure, a depth of the buried gate 108A formed in the recess 104 within the STI 102 can be greater than a depth of the buried gate 108B formed in the recess 104 within the substrate 100.

Figure 4:
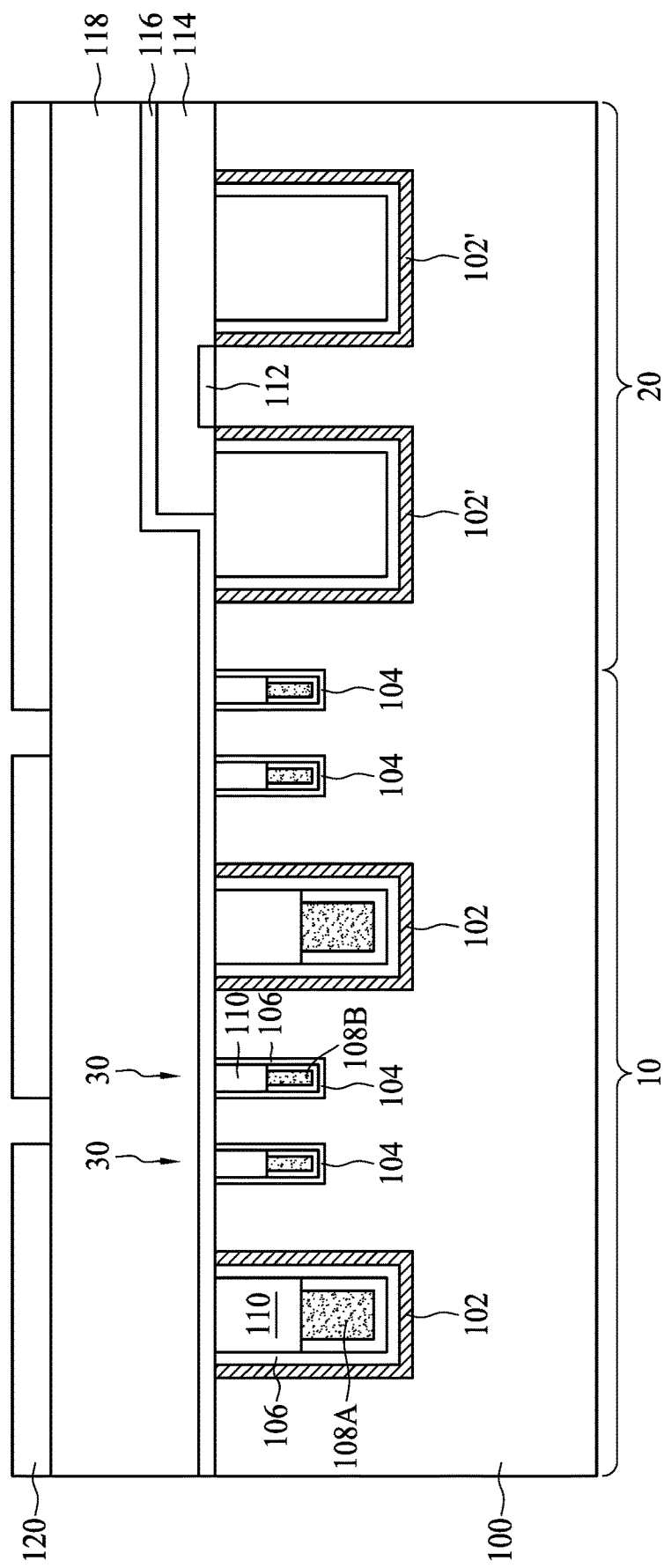

Referring to FIG. 4, which is a schematic drawing of a step performed subsequent to the step of FIG. 3, after the buried gates 108A, 108B are formed in the recesses 104 and 104', the recesses 104 and 104' are sealed with an insulating layer 110. As a result, a plurality of gate structures 30 are obtained. However, it should be easily understood by those skilled in the art that the gate structures 30 can be formed by any other suitable fabricating steps. The gate structures 30 include dynamic random access memory (hereinafter abbreviated as DRAM) cells in accordance with the embodiment. However, the gate structures 30 can include any type of memory cells required in other embodiments of the present disclosure.

Still referring to FIG. 4, after the gate structures 30 are obtained, a gate dielectric layer 112 is then formed in the peripheral region 20 between the STI 102'. After the forming of the gate dielectric layer 112 in the peripheral region 20, a first semiconductor layer 114 is formed on the substrate 100 and patterned. Accordingly, the first semiconductor layer 114 remains in the peripheral region 20 and a part of the peripheral region 20 is not covered by the first semiconductor layer 114. Subsequently, an insulating layer 116 is formed on the substrate 100 so as to cover the first semiconductor layer 114 and the substrate 100. As shown in FIG. 4, the insulating layer 116 is in contact with both the first semiconductor layer 114 and the substrate 100. In some embodiments of the present disclosure, the first semiconductor layer 114 includes an amorphous silicon layer, and a thickness of the first semiconductor layer 114 can be about 300 angstroms (Å), but is not limited thereto. In some embodiments of the present disclosure, the insulating layer 116 can be a multi-layered structure including, for example but not limited to, an oxide-nitride-oxide (ONO) structure, and a thickness of the insulating layer 116 can be greater than 80 Å. However, in other embodiments of present disclosure, the insulating layer 116 can be a dual-layered or single-layered structure, and the thickness of the insulating layer 116 may have any suitable value based on requirements.

Thereafter, a sacrificial layer 118 is blanketly formed on the insulating layer 116 on the substrate 100 and a patterned hard mask 120 is formed on the sacrificial layer 118. The sacrificial layer 118 can be an organic dielectric layer, but is not limited thereto. Preferably, the patterned hard mask 120 includes patterns defining placement and size of contact plugs to be formed.

Figure 5:
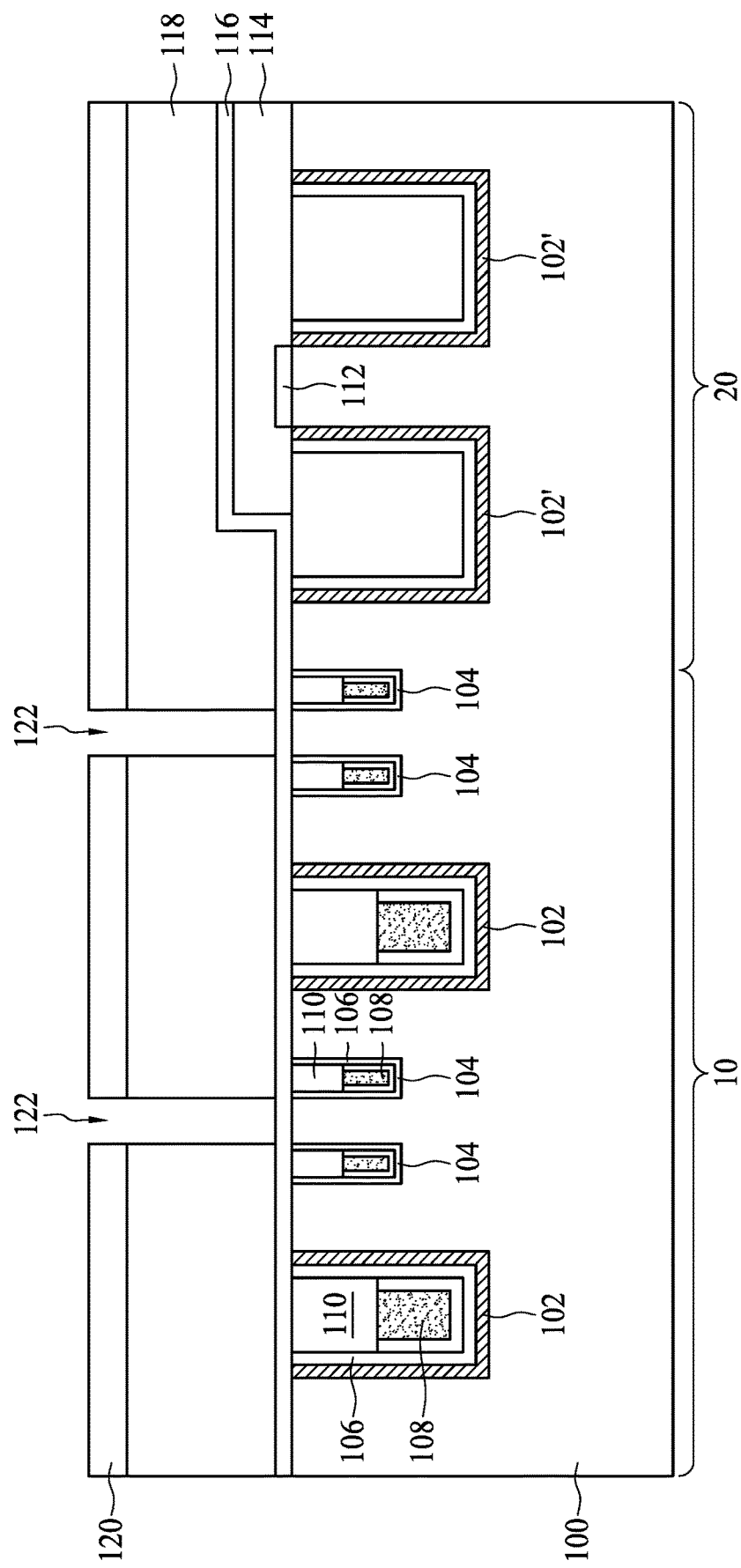

FIG. 5 is a schematic view of a step subsequent to the step illustrated in FIG. 4. After the patterned hard mask 120 is formed, the patterns are transferred from the patterned hard mask 120 to the sacrificial layer 118 by performing a selective etching process, for example, and thus a plurality of openings 122 are obtained as shown in FIG. 5. It should be noted that the insulating layer 116 is exposed at bottoms of the openings 122.

Figure 6:
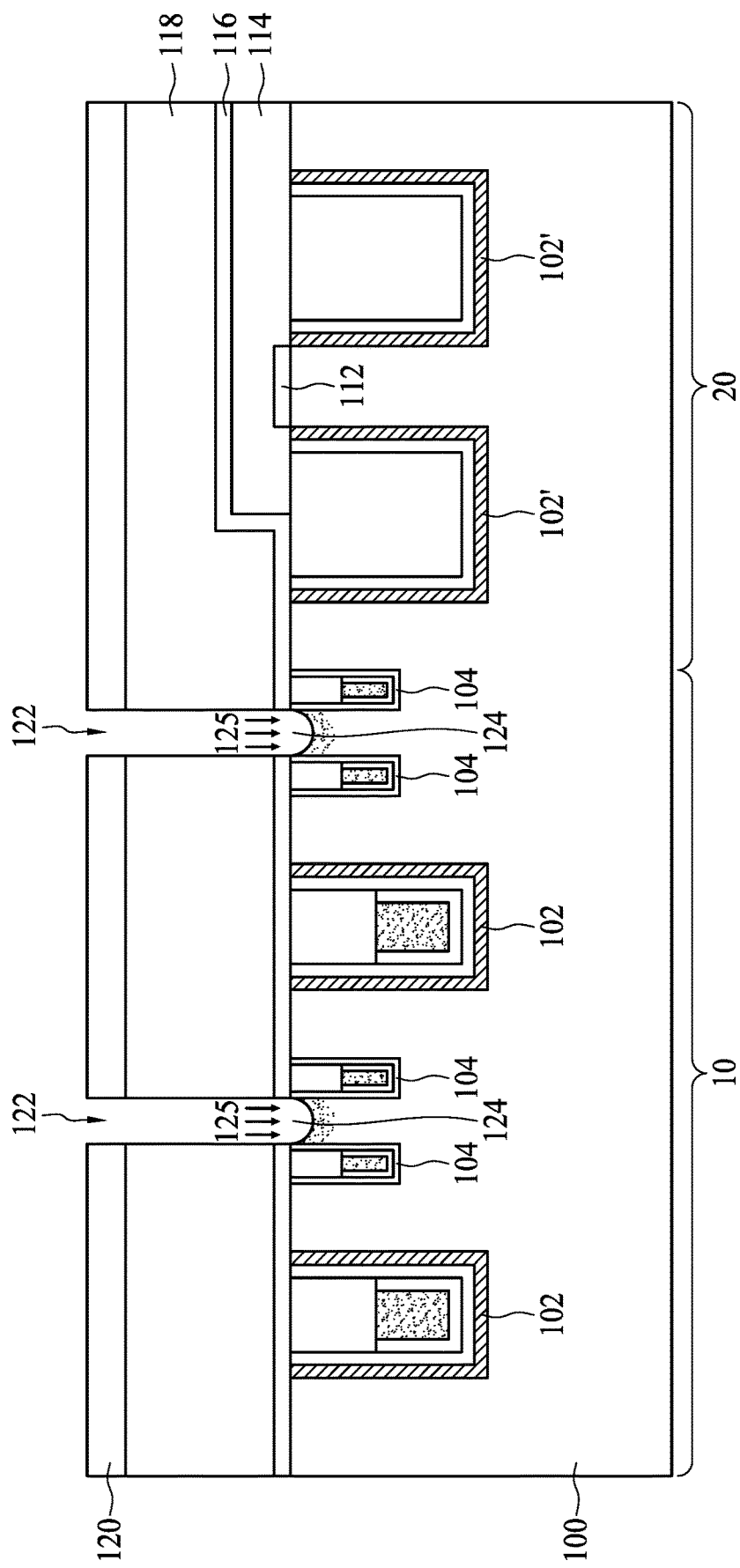

FIG. 6 is a schematic view of a step subsequent to the step illustrated in FIG. 5. As illustrated in FIG. 6, the insulating layer 116 exposed at the bottoms of the openings 122 and portions of the substrate 100 under the exposed insulating layer 116 are removed. After removing the exposed insulating layer 116 and the substrate 100 underneath, a plurality of recesses 124 are formed in the memory cell region 10. It should be noted that the substrate 100 is therefore exposed at bottoms of the recesses 124. Next, dopants such as p-typed dopants are implanted, for example, by an ion implantation process 125, into the substrate 100 exposed at the bottoms of the recesses. The dopants are introduced to form doped portions of the substrate 100 for leakage prevention.

Figure 7:
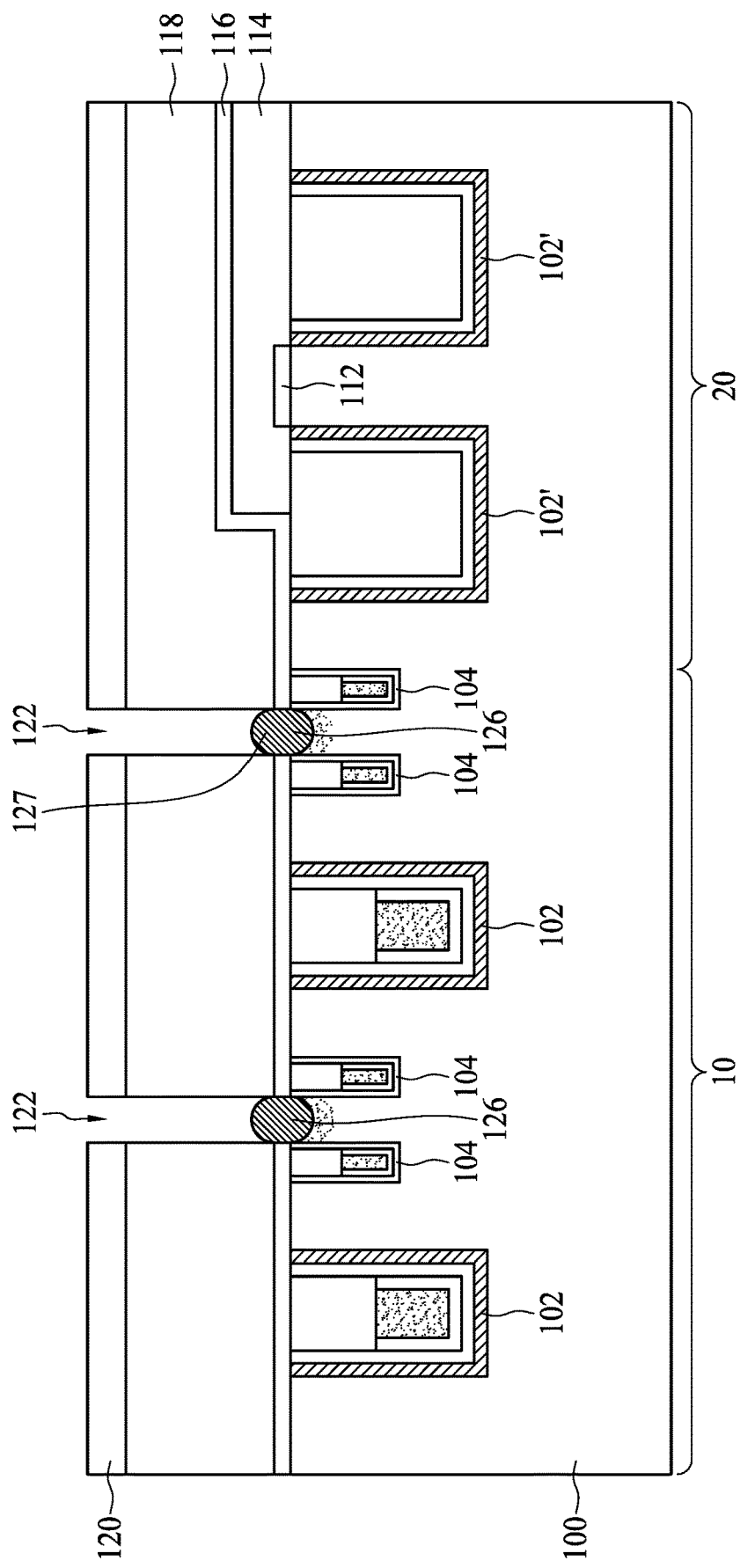

Referring to FIG. 7, which is a schematic view of a step subsequent to the step illustrated in FIG. 6, a crystalline overlayer 126 is epitaxially grown on the exposed portions of the substrate 100 within the openings 122. In some embodiments of the present disclosure, the crystalline overlayer 126 has a conductivity less than a conductivity of the doped portions of the substrate 100. Moreover, in some embodiments of the present disclosure, the crystalline overlayer 126 is selectively grown through the openings 122 to form a saddle shape having an excess portion 127 protruding from the substrate 100.

Figure 8:
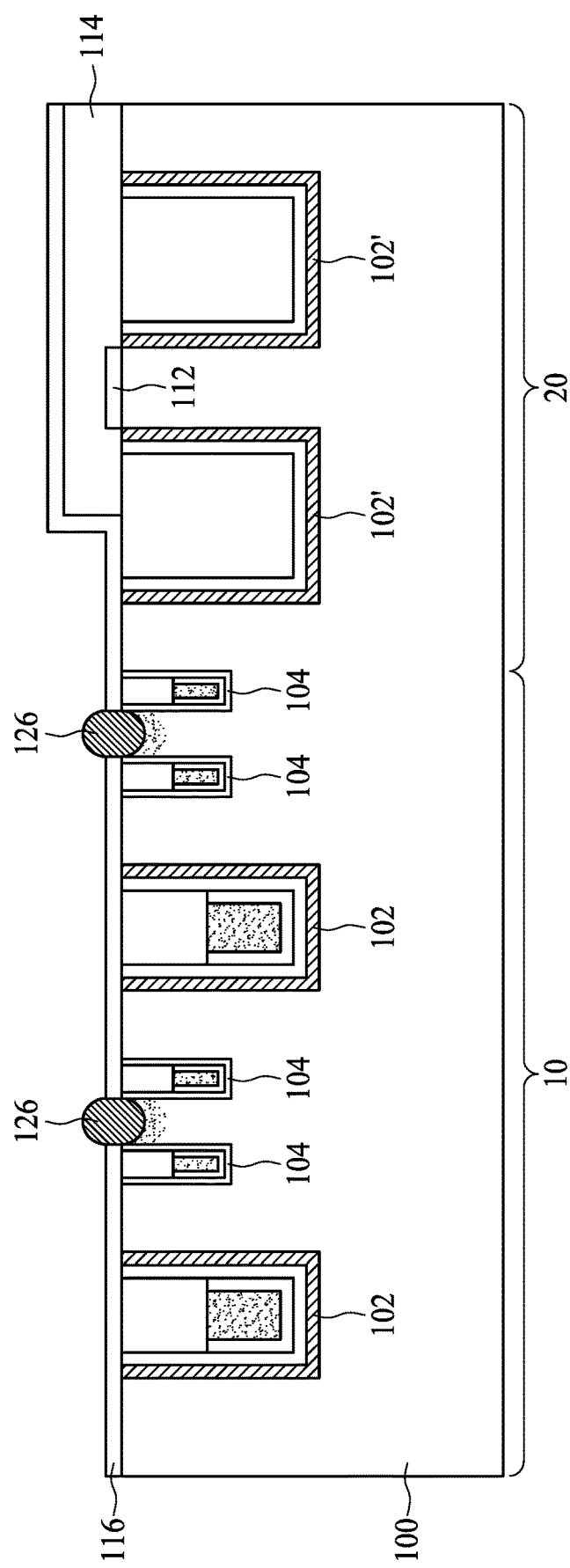

FIG. 8 is a schematic view of a step subsequent to the step illustrated in FIG. 7. As illustrated in FIG. 8, the sacrificial layer 118 and the patterned hard mask 120 are removed, leaving the crystalline overlayer 126 protruding beyond the top surfaces of the insulating layer 116 and the substrate 100.

Figure 9:
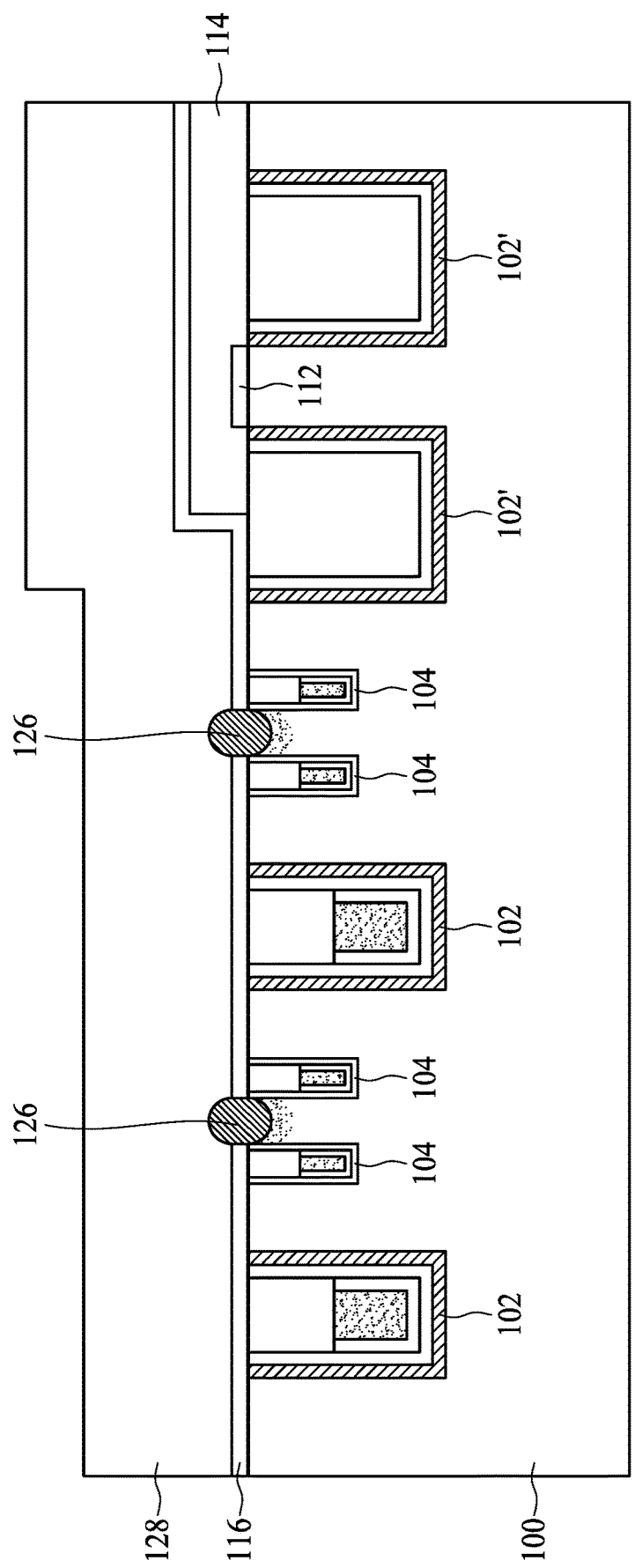

FIG. 9 is a schematic view of a step subsequent to the step illustrated in FIG. 8. After the sacrificial layer 118 and the patterned hard mask 120 are removed, a second semiconductor layer 128 is formed on the substrate 100. As shown in FIG. 9, the second semiconductor layer 128 covers the crystalline overlayer 126, the first semiconductor layer 114 and the insulating layer 116. The second semiconductor layer 128 and the first semiconductor layer 114 preferably include the same material. Therefore, in some embodiments of the present disclosure, the second semiconductor layer 128 includes a doped amorphous silicon layer, and a thickness of the second semiconductor layer 128 can be greater than 800 Å, but is not limited thereto.

Figure 10:
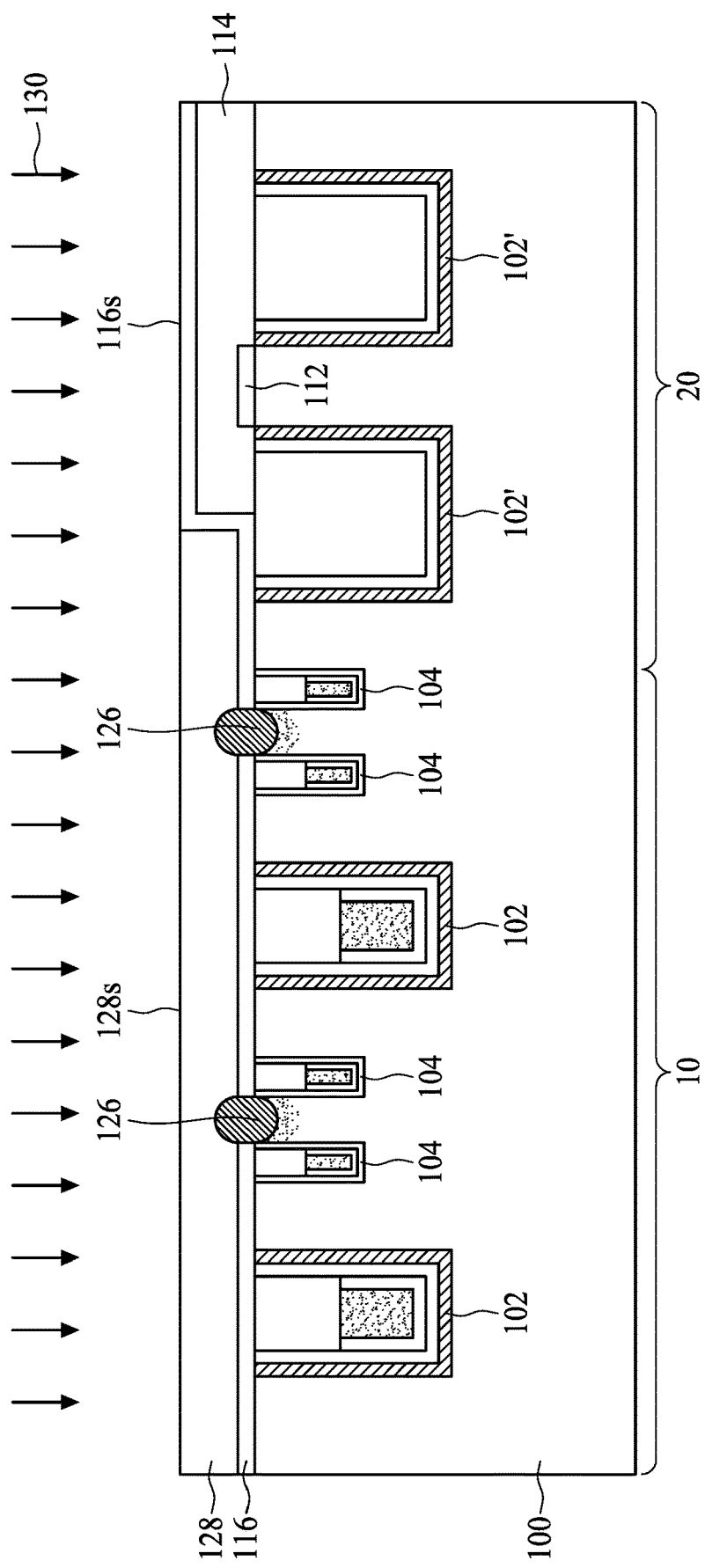

FIG. 10 is a schematic view of a step subsequent to the step illustrated in FIG. 9. After the forming of the second semiconductor layer 128, a two-stepped planarization process, such as a two-stepped CMP process, is performed. The two-stepped CMP process can refer to a CMP with two steps performed by one apparatus. As shown in FIG. 10, a first planarization step 130 is performed to remove a portion of the second semiconductor layer 128, and the first planarization step 130 stops at a top surface 116s of the insulating layer 116. Consequently, the insulating layer 116 is exposed, and therefore a top surface 128s of the second semiconductor layer 128 and the top surface 116s of the insulating layer 116 are coplanar after the first planarization step as shown in FIG. 10. On the other hand, the first semiconductor layer 114 is still covered and protected by the insulating layer 116.

Figure 11:
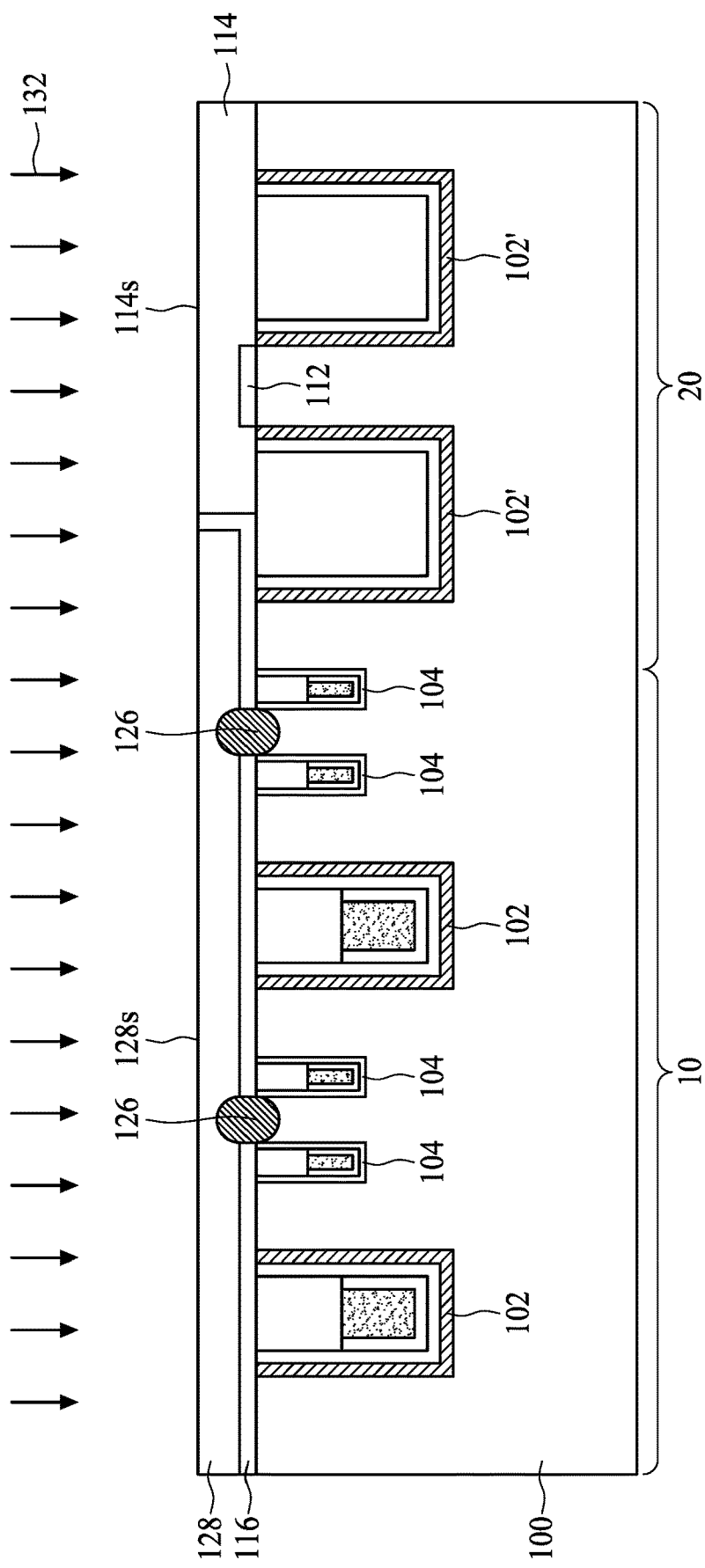

FIG. 11 is a schematic view of a step subsequent to the step illustrated in FIG. 10. As shown in FIG. 11, a second planarization step 132 is performed to remove a portion of the second semiconductor layer 128 and a portion of the insulating layer 116 to expose the first semiconductor layer 114. The second planarization step 132 preferably includes low removal rate (RR) with non-selectivity slurry, and thus the second semiconductor layer 128 and the insulating layer 116 are equally removed. Accordingly, the two-stepped CMP process is performed to remove a portion of the second semiconductor layer 128 and the insulating layer 116 to expose the first semiconductor layer 114. Consequently, a top surface 114s of the first semiconductor layer 114 and the top surface 128s of the second semiconductor layer 128 are coplanar after the second planarization step 132.

Figure 12:
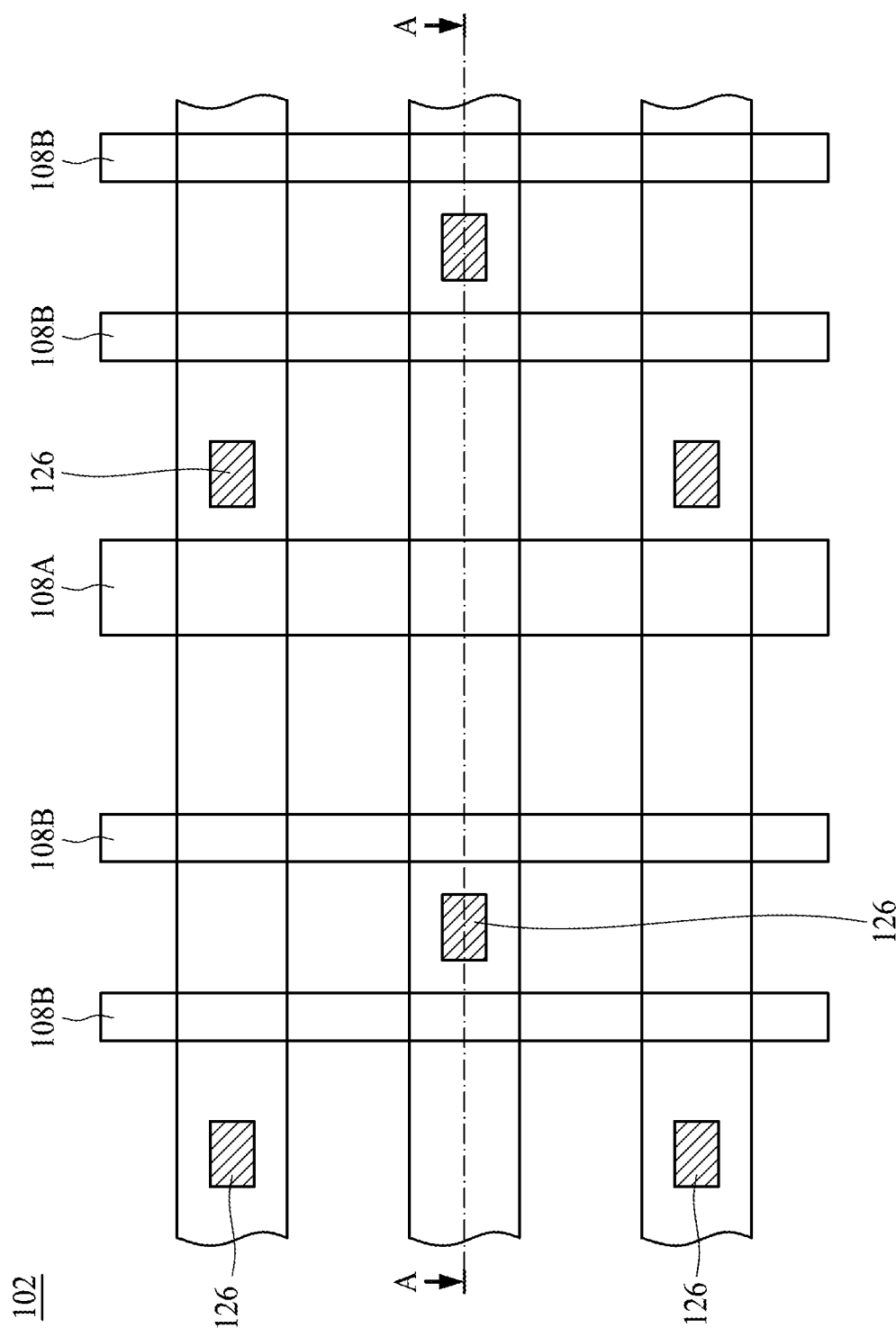
Figure 13:
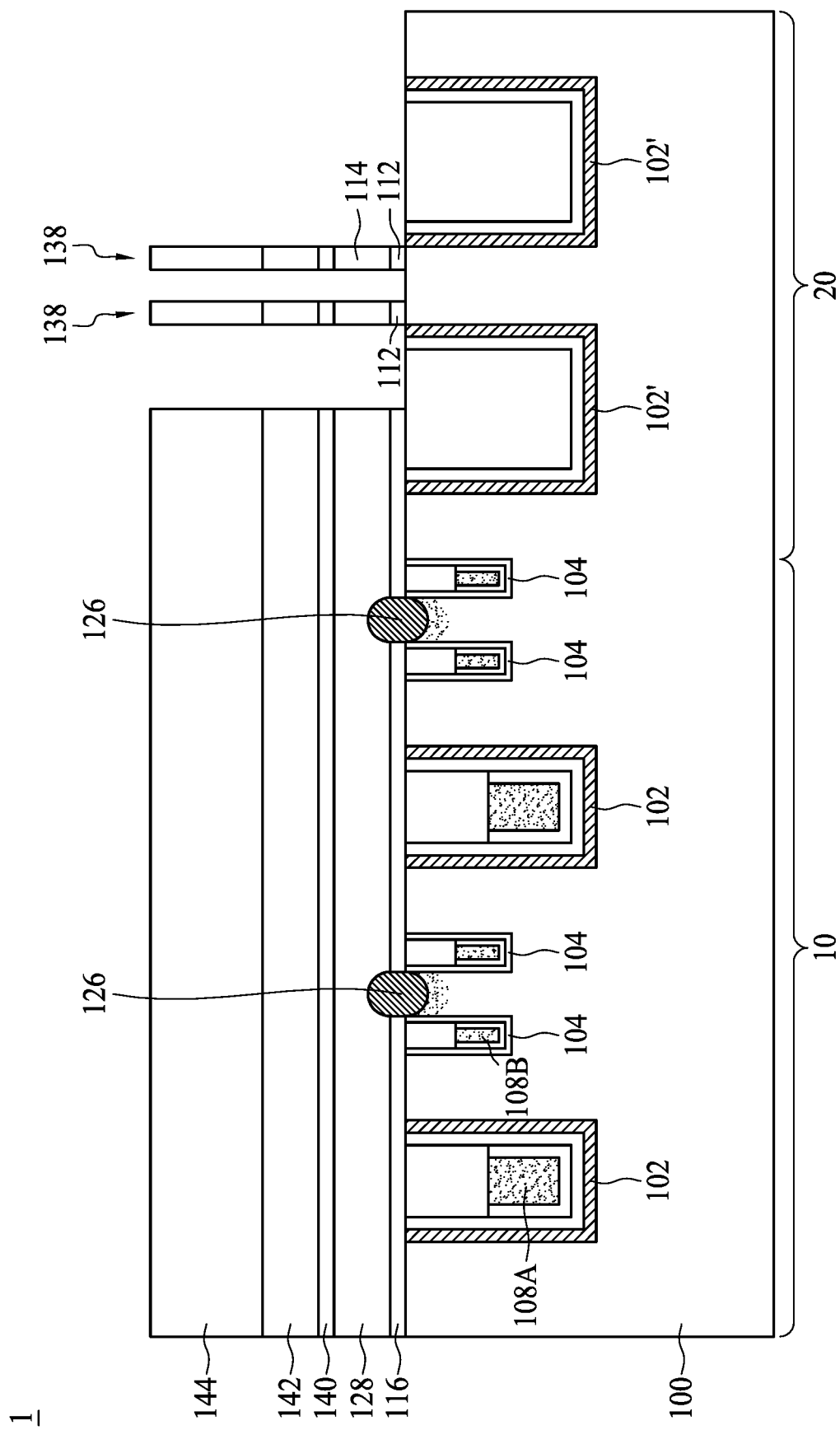

FIGS. 12 and 13 are schematic drawings illustrating a step subsequent to the step illustrated in FIG. 11. It should be noted that a part of the memory cell region 10 depicted in FIG. 13 is also shown in a cross-sectional view taken along a line A-A of FIG. 12, especially the area in the proximity of the two crystalline overlayers 126. After obtaining the coplanar surface 114s/128s formed by the first semiconductor layer 114 and the second semiconductor layer 128, a multi-layered structure is formed on the substrate 100. In some embodiments of the present disclosure, the multi-layered structure can include, for example but not limited to, a Ti/TiN layer 140, a WSix/W layer 142 and a patterned hard mask 144. The patterned hard mask 144 can include a SiO layer and/or a SiN layer, but is not limited thereto. The Ti/TiN layer 140, the WSix/W layer 142, the first semiconductor layer 114 and the second semiconductor layer 128 are then respectively patterned to form a plurality of active devices 138 in the peripheral region 20. In some embodiments, the crystalline overlayer 126 serves as a contact plug connecting the doped region underneath (serving as source/drain) to a bit line.

Figure 14:
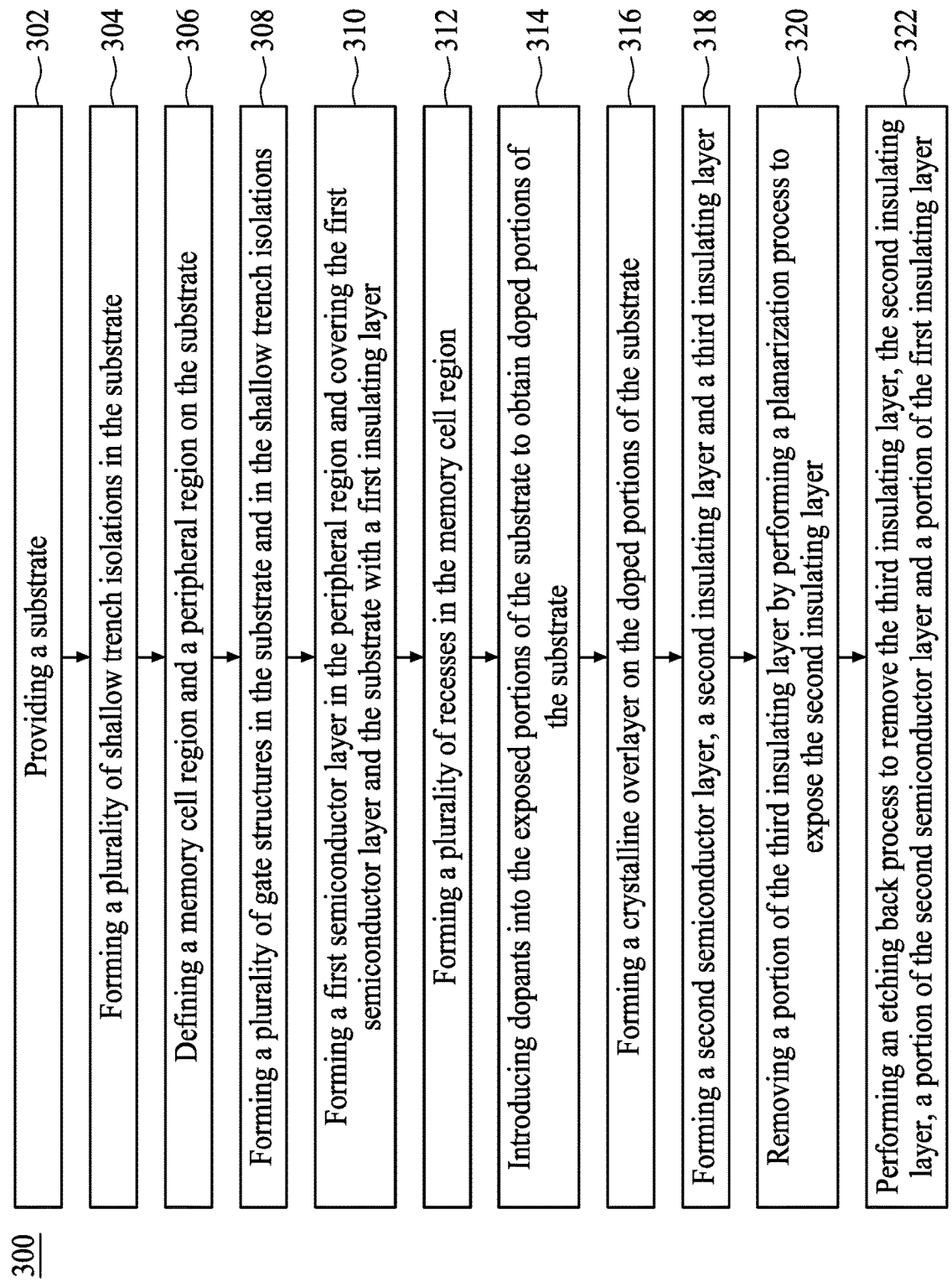
FIG. 14 is a flow diagram illustrating a method for preparing a semiconductor device in accordance to a second embodiment of the present disclosure.

FIG. 14 is a flow diagram illustrating a method 300 for preparing a semiconductor device in accordance to a second embodiment of the present disclosure. As illustrated in FIG. 14, the present disclosure provides the method 300 for preparing the semiconductor device with the following steps. In step 302, a substrate is provided. In step 304, a plurality of shallow trench isolations are formed in the substrate. In step 306, a memory cell region and a peripheral region are defined on the substrate. In step 308, a plurality of gates are formed in the substrate and in the shallow trench isolations. In step 310, a first semiconductor layer is formed in the peripheral region, and the first semiconductor layer and the substrate are covered with a first insulating layer. In step 312, a plurality of recesses are formed in the memory cell region. In step 314, dopants are introduced into the exposed portions of the substrate to obtain doped portions of the substrate. In step 316, a crystalline overlayer is formed on the doped portions of the substrate. In some embodiments, the crystalline overlayer has a conductivity less than that of the doped portions of the substrate. In step 318, a second semiconductor layer, a second insulating layer and a third insulating layer are formed. In some embodiments, the first semiconductor layer and the first insulating layer on the substrate are covered by the third insulating layer. In step 320, a portion of the third insulating layer is removed by performing a planarization process to expose the second insulating layer, such that a top surface of the third insulating layer and a top surface of the second insulating layer are coplanar. In step 322, an etch-back process is performed to remove the third insulating layer, the second insulating layer, a portion of the second semiconductor layer and a portion of the first insulating layer, such that a top surface of the first semiconductor layer and a top surface of the second semiconductor layer are coplanar. In some embodiments, each of the memory cell region and the peripheral region has at least one shallow trench isolation. In some embodiments, portions of the substrate are exposed at bottoms of the recesses.

Figure 15:
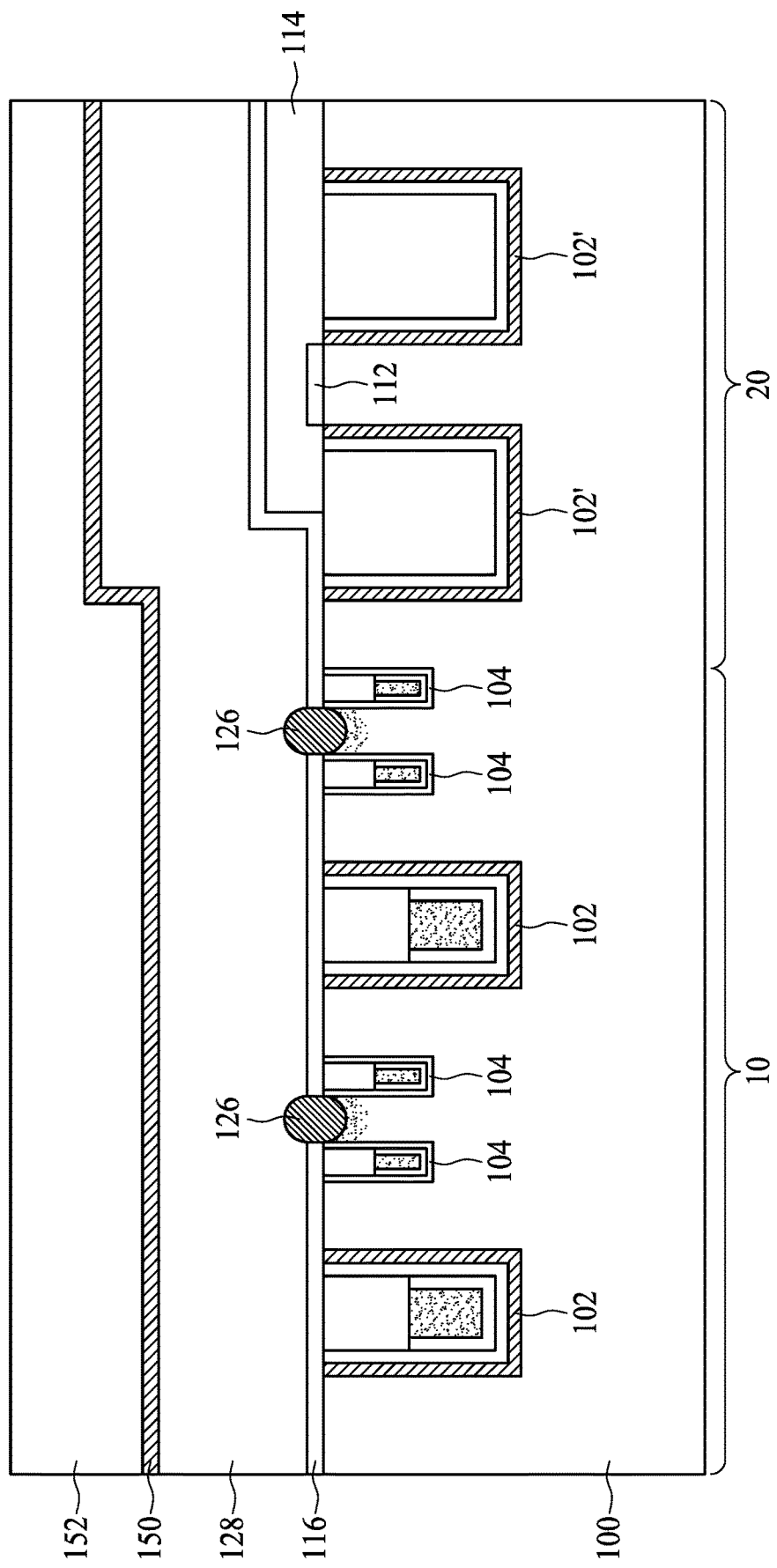
FIGS. 15 to 17 are schematic views illustrating stages of preparing a semiconductor device by the method of FIG. 14 in accordance with some embodiments of the present disclosure.
Figure 16:
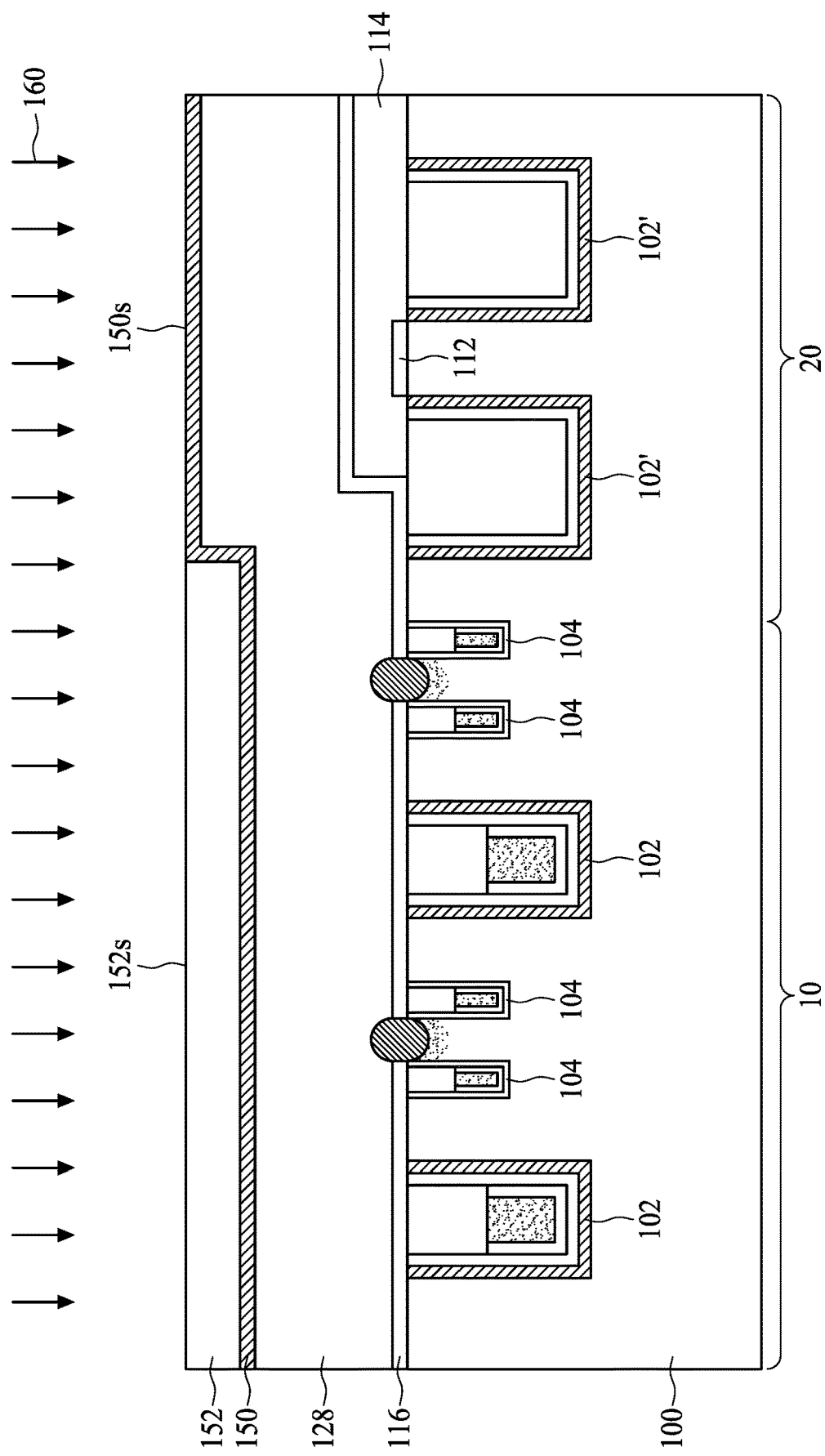
Figure 17:
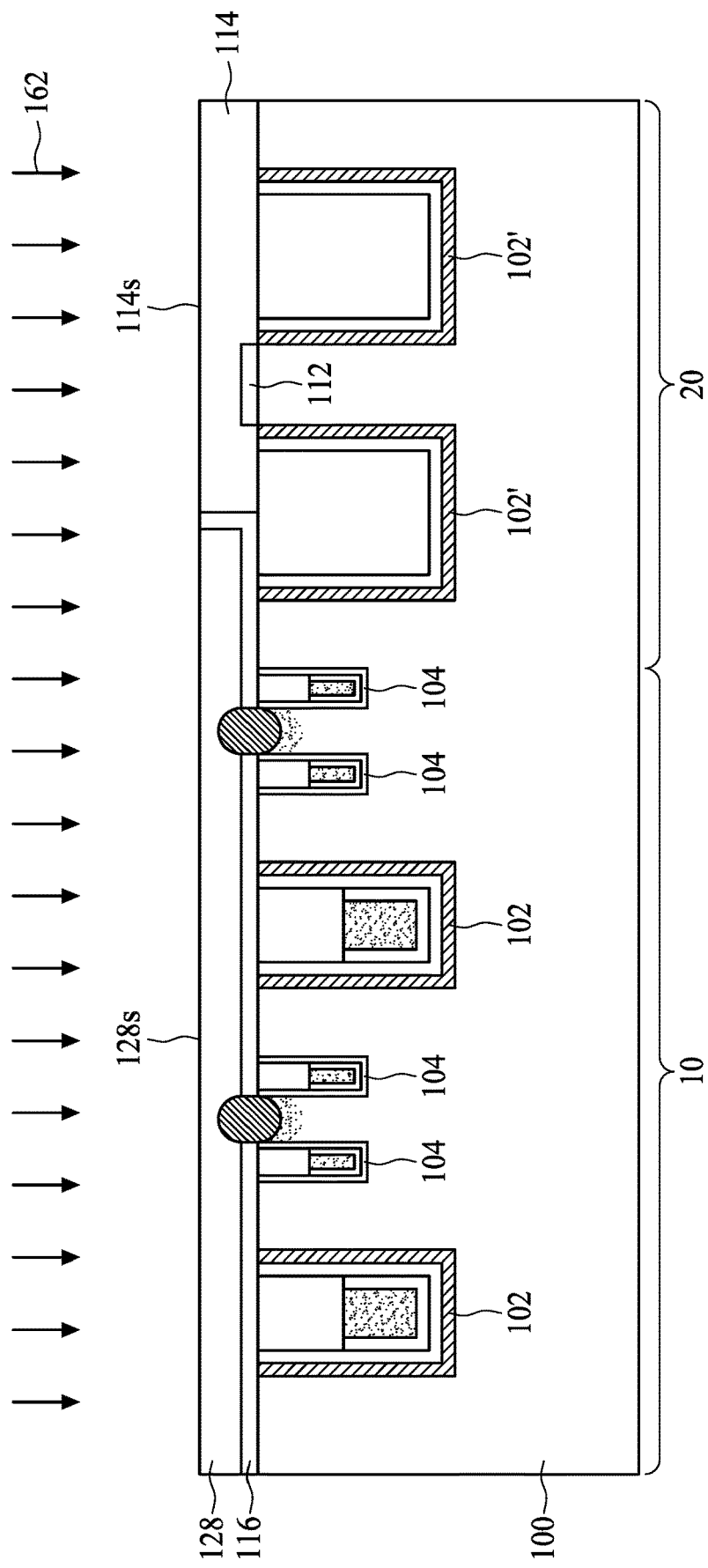

FIGS. 15 to 17 are schematic views illustrating stages of preparing a semiconductor device by the method of FIG. 14 in accordance with some embodiments of the present disclosure. It should be noted that elements that are the same in both of the first and second embodiments are designated by the same numerals and can be fortified by the same steps with the same material. Therefore, details about those elements are omitted hereinafter in the interest of brevity. It should also be noted that the second embodiment includes some steps identical to steps of the first embodiment as shown in FIGS. 2 to 13, and thus all details about those steps are omitted for simplicity.

Referring to FIG. 15, a second semiconductor layer 128, another insulating layer 150 and still another insulating layer 152 are sequentially formed on the substrate 100. As shown in FIG. 15, the second semiconductor layer 128, the insulating layer 150 and the insulating layer 152 cover the first semiconductor layer 114 and the insulating layer 116. The second semiconductor layer 128 and the first semiconductor layer 114 preferably include a same material. Therefore in some embodiments of the present disclosure, the second semiconductor layer 128 includes an amorphous silicon layer. Preferably, the second semiconductor layer 128 includes a doped amorphous silicon layer. A thickness of the second semiconductor layer 128 can be greater than 800 Å, but is not limited thereto. It should be noted that the insulating layer 150 and the insulating layer 152 include different materials. For example but not limited thereto, the insulating layer 152 includes silicon oxide (SiO) while the insulating layer 150 sandwiched between the insulating layer 152 and the second semiconductor layer 128 includes silicon nitride (SiN). Furthermore, a thickness of the insulating layer 150 is greater than 50 Å while a thickness of the insulating layer 152 is greater than 800 Å, but the thicknesses are not limited thereto. It should be noted that the insulating layer 152 is preferably thick enough to form an even surface, as shown in FIG. 15.

FIG. 16 is a schematic drawing of a step subsequent to the step illustrated in FIG. 15. After the forming of the insulating layer 152, a planarization process, such as a CMP process 160, is performed. As shown in FIG. 16, the CMP process 160 is performed to remove a portion of the third insulating layer 152, and the CMP process 160 stops at the insulating layer 150. Consequently, the insulating layer 150 is exposed, and thus a top surface 150S of the insulating layer 150 and a top surface 152S of the insulating layer 152 are coplanar.

FIG. 17 is a schematic drawing of a step subsequent to the step illustrated in FIG. 16. As shown in FIG. 17, an etch-back process 162 is performed to remove the insulating layer 152, the insulating layer 150, a portion of the second semiconductor layer 128 and a portion of the insulating layer 116. Additionally, the insulating layer 152 and insulating layer 150 are entirely removed as shown in FIG. 17. Thus, the first semiconductor layer 114 is exposed. Accordingly, a top surface 114S of the first semiconductor layer 114 and a top surface 128S of the second semiconductor layer 128 are coplanar after the etch-back process 162.

According to the methods 200 and 300 for forming the semiconductor device 1, the insulating layer 152 and the insulating layer 150 are introduced to eliminate the step height issue. Consequently, high uniformity across regions with different densities is guaranteed.

In conclusion, with the above-mentioned method for preparing the semiconductor device, a crystalline overlayer is epitaxially grown on the channel; thus, short channel effect can be effectively reduced and the performance of the semiconductor device can be improved.

One aspect of the present disclosure provides a method of preparing a semiconductor device. The method includes steps of providing a substrate; forming a plurality of shallow trench isolations in the substrate; defining a memory cell region and a peripheral region on the substrate; forming a plurality of gates in the substrate and in the shallow trench isolations; forming a first semiconductor layer in the peripheral region and covering the first semiconductor layer and the substrate with a first insulating layer; forming a plurality of recesses in the memory cell region; epitaxially growing a crystalline overlayer on the exposed portions of the substrate; forming a second semiconductor layer, a second insulating layer and a third insulating layer, wherein the first semiconductor layer and the first insulating layer on the substrate are covered by the third insulating layer; removing a portion of the third insulating layer by performing a planarization process to expose the second insulating layer such that a top surface of the third insulating layer and a top surface of the second insulating layer are coplanar; and performing an etch-back process to remove the third insulating layer, the second insulating layer, a portion of the second semiconductor layer and a portion of the first insulating layer such that a top surface of the first semiconductor layer and a top surface of the second semiconductor layer are coplanar. In some embodiments, each of the memory cell region and the peripheral region has at least one shallow trench isolation. In some embodiments, portions of the substrate are exposed at bottoms of the recesses.

One aspect of the present disclosure provides a method of preparing a semiconductor device. The method includes steps of providing a substrate; forming a plurality of shallow trench isolations in the substrate; defining a memory cell region and a peripheral region on the substrate; forming a plurality of gates in the substrate and in the shallow trench isolations; forming a first semiconductor layer in the peripheral region and covering the first semiconductor layer and the substrate with a first insulating layer; forming a plurality of recesses in the memory cell region; introducing dopants into the exposed portions of the substrate to obtain doped portions of the substrate; forming a crystalline overlayer on the doped portions of the substrate, wherein, in some embodiments, the crystalline overlayer has a conductivity lower than that of the doped portions of the substrate; forming a second semiconductor layer, a second insulating layer and a third insulating layer, wherein the first semiconductor layer and the first insulating layer on the substrate are covered by the third insulating layer; removing a portion of the third insulating layer by performing a planarization process to expose the second insulating layer such that a top surface of the third insulating layer and a top surface of the second insulating layer are coplanar; and performing an etch-back process to remove the third insulating layer, the second insulating layer, a portion of the second semiconductor layer and a portion of the first insulating layer such that a top surface of the first semiconductor layer and a top surface of the second semiconductor layer are coplanar. In some embodiments, each of the memory cell region and the peripheral region has at least one shallow trench isolation. In some embodiments, portions of the substrate are exposed at bottoms of the recesses.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate having a memory cell region and a peripheral region, wherein the memory cell region has at least one first shallow trench isolation and a plurality of recesses and the peripheral region has at least one second shallow trench isolation;
   a plurality of gates, each of the plurality of gates disposed in each of the at least one first shallow trench isolation and the plurality of recesses;
   a first semiconductor layer disposed in the peripheral region;
   a first insulating layer covering the substrate in the memory cell region;
   a doped portion formed between two of the plurality of gates in the plurality of recesses and serving as a source and a drain, the doped portion including a channel;

a crystalline overlayer epitaxially deposited on the doped portion of the substrate and the channel, wherein the crystalline overlayer serves as a contact plug connecting the doped region underneath, wherein the crystalline overlayer has a conductivity lower than that of the doped portions of the substrate; and a second semiconductor layer disposed on a portion of the first insulating layer, wherein a top surface of the first semiconductor layer and a top surface of the second semiconductor layer are coplanar.

2. The semiconductor device according to claim 1, wherein the at least one first shallow trench isolation has a depth less than a depth of the second shallow trench isolation.

3. The semiconductor device according to claim 1, wherein the at least one first shallow trench isolation has a depth that is the same as a depth of the at least one second shallow trench isolation.

4. The semiconductor device according to claim 1, wherein the crystalline overlayer has a saddle shape.

5. The semiconductor device according to claim 1, wherein the crystalline overlayer has an excess portion protruding from the substrate.

* * * * *